United States Patent [19]

Yamazaki

[11] Patent Number: 4,958,591
[45] Date of Patent: Sep. 25, 1990

[54] APPARATUS FOR FORMING A FUNCTIONAL DEPOSITED FILM BY MEANS OF PLASMA CHEMICAL VAPOR DEPOSITION

[75] Inventor: Itaru Yamazaki, Nagahama, Japan

[73] Assignee: Canon Kabushiki Kaisha, Tokyo, Japan

[21] Appl. No.: 323,202

[22] Filed: Mar. 13, 1989

Related U.S. Application Data

[63] Continuation of Ser. No. 71,335, Jul. 2, 1987, abandoned.

[30] Foreign Application Priority Data

Jul. 4, 1986 [JP] Japan .................................. 61-157611

[51] Int. Cl.$^5$ .............................................. C23C 16/50
[52] U.S. Cl. ........................................................ 118/723
[58] Field of Search ........................................... 118/723

[56] References Cited

U.S. PATENT DOCUMENTS

| 4,466,380 | 8/1984 | Jansen | 118/723 |
| 4,501,766 | 2/1985 | Suzuki | 118/723 |
| 4,529,474 | 7/1985 | Fujiyama | 118/670 |
| 4,615,299 | 10/1986 | Matsuyama | 118/723 |

OTHER PUBLICATIONS

Vossen et al. *Thin Film Processes*, Academic Press, N.Y. 1978, pp. 335–339.

*Primary Examiner*—Richard Bueker
*Attorney, Agent, or Firm*—Fitzpatrick, Cella Harper & Scinto

[57] ABSTRACT

Improvements in the apparatus for forming a functional deposited film by means of plasma chemical vapor deposition comprising a deposition chamber having a film forming space which is sealed and formed by a surrounding wall functioning as a cathode, an upper wall and a bottom wall, which contains a means for holding a cylindrical substrate functioning as an anode in the film forming space and which is provided with a film forming raw material gas supplying means, a means for impressing a discharging power between said cathode and said anode and a vacumming means, that the length L of said cathode and the interval d between the inside face of said cathode and the surface of said anode is so designed as to satisfy the equation: $5 \leq L/d \leq 40$.

According to this improved apparatus, a desired light receiving memer, even if it is of a large square, which is excellent in both homogeneity in the layer quality and uniformity in layer thickness can be stably and effectively prepared at a high deposition speed.

1 Claim, 4 Drawing Sheets

APPARATUS FOR FORMING A FUNCTIONAL DEPOSITED FILM BY MEANS OF PLASMA CHEMICAL VAPOR DEPOSITION

This application is a continuation of application Ser. No. 071,335 filed July 2, 1987, now abandoned.

FIELD OF THE INVENTION

This invention relates to an improved apparatus for carrying out plasma chemical vapor deposition process which is suited for the formation of a non-single crystalline functional film, which is represented by an amorphous functional deposited film and a polycrystalline functional deposited film, for use in semiconductor device, photosensitive device for use in electrophotography, image-reading line sensor, image-pickup device, photoelectromotive force member, etc.

BACKGROUND OF THE INVENTION

As an element member to be used in a semiconductor device, photosensitive device for use in electrophotography, image-reading sensor, image-pickup device, photoelectromotive force member, etc., there have been proposed a film composed of an amorphous material containing silicon atoms as the main constituent (hereinafter referred to as "A-Si") and another kind of film which is composed of an amorphous material containing silicon atoms as the main constituent and hydrogen atoms (hereinafter referred to as "A-Si:H").

Along with the proposals of such films, there have also been proposed a number of methods by means of vacuum evaporation, thermal induced chemical vapor deposition, plasma chemical vapor deposition (plasma CVD), reactive sputtering, ion plating and light induced chemical vapor depositions for preparing such films and also, a number of apparatuses for practicing said methods.

Among those methods, the method of plasma CVD has been generally evaluated as being the most preferred and is currently used to prepare said functional deposited films on a commercial basis.

By the way, according to the method of plasma CVD, a functional deposited film is prepared by exciting film forming raw material gases with an excitation energy of direct current or microwave to generate active species capable of contributing to formation of said film in the reaction space near a substrate in a deposition chamber, which concurrently react each other to result in forming said functional deposited film on said substrate.

And there have been proposed a number of apparatuses for practicing the method of plasma CVD.

FIG. 3 is a diagrammatic illustration of a known typical apparatus for forming a deposited film on a cylindrical substrate by means of plasma CVD.

The apparatus illustrated in FIG. 3 includes a cathode 1 which serves as a surrounding wall of deposition chamber having a film forming space, a cylindrical substrate 2' disposed on a substrate holder 2, having an electric heater 8 and being mechanically connected through a rotary shaft 9 to a motor (not shown) to rotate the substrate 2' during film forming operation, which is grounded so as to make the substrate 2' to act as an anode, upper wall 3 and bottom wall 13 respectively of the deposition chamber, both of which are insulated from the cathode 1 by electrical porcelains 4. In FIG. 3, reference numeral 5 stands for a high frequency power source which is electrically connected to a raw material gas supplying pipe 6 extended from gas reservoirs (not shown) which is connected to the surrounding wall (cathode) 1 and open into the space formed by the inner face of the surrounding wall (cathode) 1 and an inside wall 11 having a number of gas liberation holes 10, 10, —to allow raw material gas to be fed dispersedly against the surface of the substrate 2' in the film forming space. The bottom wall 13 is provided with an exhaust pipe 7 which is connected through an exhaust valve (not shown) to a vacuum pump (not shown).

FIG. 4 is a diagrammatic illustration of another known typical apparatus for forming a deposited film on a cylindrical substrate by means of plasma CVD, which is a partial modification of the apparatus illustrated in FIG. 3. In FIG. 4, the same reference numerals as in FIG. 3 respectively mean the same members of the apparatus illustrated in FIG. 3.

In the apparatus illustrated in FIG. 4, raw material gas is fed dispersedly against the surface of the substrate 2' through gas liberation holes 10, 10, —of each of plural gas feed pipes 12 installed vertically and in parallel with the substrate 2' in the film forming space of the deposition chamber.

Operation of forming a deposited film on a substrate in such apparatus as above mentioned by means of plasma CVD is practiced as below described.

That is, gases in the deposition chamber are exhausted and the inner atmosphere of the deposition chamber is vacuumed through the exhaust pipe 7 to a predetermined vacuum. Successively, the cylindrical substrate 2' is heated to and kept at a predetermined temperature by activating the heater 8, and it is rotated by means of the motor. Then, film forming raw material gas, for instance, silane gas in the case of forming a deposited film composed of an amorphous material containing silicon atoms and hydrogen (hereinafter referred to as "A-Si:H"), is fed through the gas liberation holes 10, 10, —either of the inside wall 11 in case of the apparatus illustrated in FIG. 3 or of the gas feed pipes 12 in case of the apparatus illustrated in FIG. 4 into the film forming space of the deposition chamber. At the same time, a high frequency power from the high frequency power source 5 is impressed between the cathode 1 and the substrate 2' (anode) to thereby cause plasma discharging in the film forming space, which excites the raw material gas to generate radical particles such as Si*, SiH* etc. (the symbol * means an excited state), electrons and ion particles thereof which cause formation of a deposited film on the substrate 2'.

In the above mentioned operation of forming a deposited film, the thickness and the quality of a deposited film to be formed is influenced by the pressure and the flow rate of a film forming raw material gas to be introduced into the deposition chamber, the discharging power to form gas plasmas in the film forming space, etc. And in particular, the distribution state of the strength in plasma discharge will be an important factor in order to a desired deposited film of uniform film quality which has an uniform layer thickness. However, in an apparatus of the type of either FIG. 3 or FIG. 4 for forming a deposited film in accordance with the method of plasma CVD, there are still left problems as being unsolved that the distribution state of the strength in plasma discharge often becomes uneven from upper portion through middle portion to lower portion in the film forming space of the deposition chamber to thereby make the resulting deposited film uneven in its quality and layer thickness accordingly. And, the longer the cylindrical substrate becomes, the more said problems becomes significant.

Against this background, there is now an increased demand for making appropriate improvements in such apparatus as above mentioned for forming a deposited film in accordance with the method of plasma CVD so that a desired deposited film of uniform and high film quality which has an uniform layer thickness can be stably and effectively obtained without occurrence of the above mentioned problems in a simple apparatus.

SUMMARY OF THE INVENTION

The present inventor has conducted extensive studies in order to solve the problems in the known apparatuses for forming a deposited film by means of plasma CVD and in order to make an appropriate improvement in said known apparatuses so as to enable stable and effective formation of a desired deposited film and also to meet the aforementioned demand.

As a result, the present inventor has found the facts detailed below and finally succeeded in completing this invention based on that facts.

It is an object of this invention to provide an improved apparatus for forming a deposited film by means of plasma CVD which makes it possible for the strength in plasma discharge to be maintained uniformly throughout the film forming space surrounding the surface of the cylindrical substrate in the deposition chamber and which enable one to stably and effectively form a desired deposited film of uniform layer quality which has an uniform layer thickness.

Another object of this invention is to provide an improved apparatus for forming a deposited film by means of plasma CVD which makes it possible to mass-produce a desired deposited film, even of large area, while realizing improvements in the characteristics, the film forming rate and the reproductiveness of the resulting deposited film and accomplishing homogeneity in the layer quality and uniformity in the layer thickness of that deposited film.

The above-described and other objects, advantages, and features of this invention will become more apparent upon making reference to the specification to follow, the claims and the drawings.

DESCRIPTION OF EXAMPLARY FORMS OF THE INVENTION SHOWN IN DRAWINGS

Figure 1:
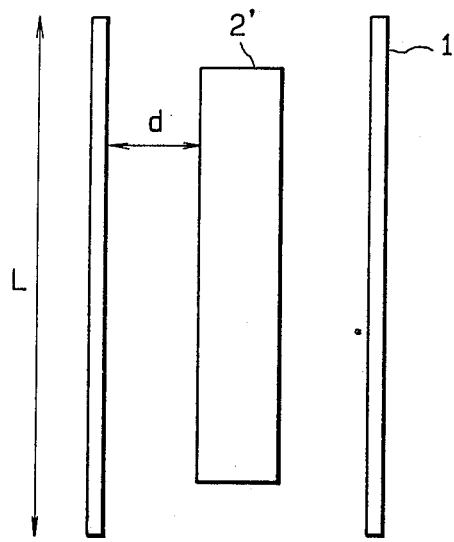
FIG. 1 is a schematic explanatory view illustrating the interval d between the cathode 1 and the anode 2' and the length L of the cathode 1 in the apparatus for forming a deposited film on a cylindrical substrate (anode 2') by means of plasma CVD (hereinafter referred to as "plasma CVD deposited film forming apparatus") according to this invention.
Figure 3:
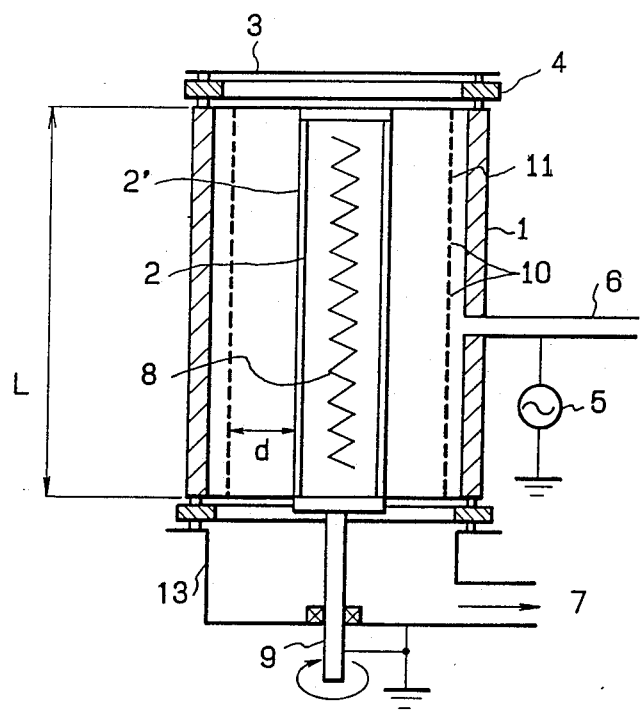
FIG. 3 and FIG. 4 are diagrammatic illustrations of known typical plasma CVD deposited film forming apparatuses.
Figure 4:
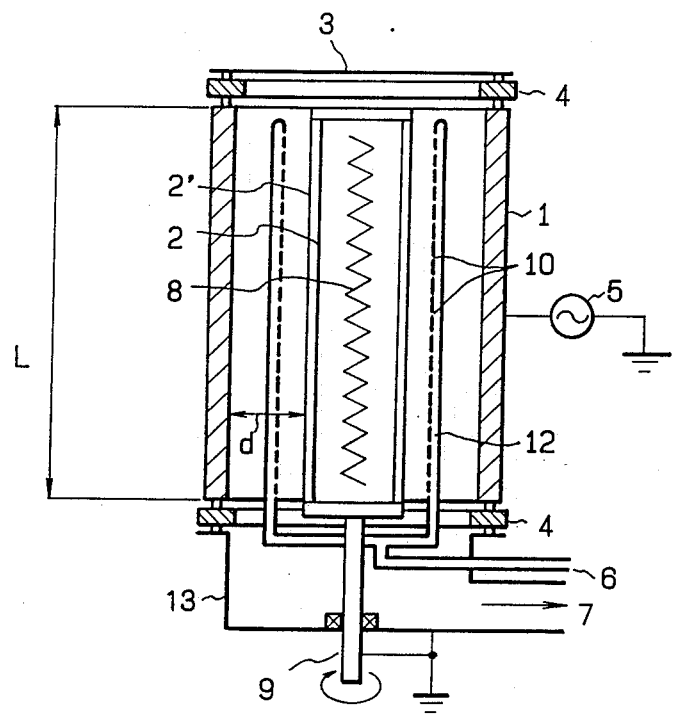

Refer now more particularly to FIG. 1 where are shown a surrounding wall 1 of a length L which acts as a cathode and a cylindrical substrate 2 which acts as an anode and which is situated leaving an interval d between the inside face of the surrounding wall (cathode) 1 and the surface of the cylindrical substrate (anode) 2' in the plasma CVD deposited film forming apparatus as shown in FIG. 3 or FIG. 4.

As a result of extensive studies in order to solve the foregoing problems which are found on the known plasma CVD deposited film forming apparatuses and in order to attain the above mentioned objects of this invention, the present inventor has found that the relationship between the above mentioned interval d and the above mentioned length L will greatly affect on the distribution state of plasma discharge in the film forming space of the deposition chamber of the plasma CVD deposited film forming apparatus.

That is, in the case where the above mentioned interval d is too small, a deposited film to be formed on a cylindrical substrate often receives attacks of ion particles, etc. to be generated during the film forming operation to thereby make the resulting film inferior in the film quality. On the other hand, in the case where it is too large, plasma discharge will not sufficiently occur and as a result, the distribution state of plasmas to be formed will be accordingly uneven in the film forming space surrounding the surface of the cylindrical substrate. Therefore, in this case, it is difficult to obtain a desired deposited film which is homogeneous in layer quality and uniform in layer thickness.

Further, in the case where the length L of the cathode 1 is relatively large and the interval d is relatively small, the distribution states of plasmas in the longitudinal direction and/or the circumferential direction of the cylindrical substrate 2' becomes uneven and as a result, the resulting deposited film will be such that it is inferior in both uniformity in layer thickness and homogeneity in layer quality. In addition, in the case where the length L of the cathode 1 is relatively short in the above case, the raw material gas will greatly become exhausted from the film forming space without being entirely decomposed and as a result, not only the utilization coefficient of the raw material gas will be undesirably reduced but also the resulting deposited film will be such that it is less usable.

As a result of further studies on the basis of the above findings, the present inventor has found that, in the case where, in the plasma CVD deposited film forming apparatus, the interval d between the inside face of the surrounding wall (cathode) 2 and the surface of cylindrical substrate (anode) 2' is in the range between 50 mm and 100 mm and the length L of the surrounding wall (cathode) 1 is in the range between 500 mm and 2000 mm, plasma discharge will sufficiently occur stably and evenly throughout the surface of the cylindrical substrate 2' in the film forming space to thereby constantly form a desired deposited film which is excellent in layer quality and layer thickness without receiving any damage such as attacks of ion particles, etc. in the film forming operation.

As a result of the above mentioned findings, the present inventor has found that when the deposition chamber of the plasma CVD deposited film forming apparatus is so designed that the length L of the surrounding wall (cathode) 1 and the interval d between the inside face of the surrounding wall (cathode) 1 and the surface of the cylindrical substrate 2' satisfies the equation: $5 \leq L/d \leq 40$, the foregoing problems which are found on the conventional plasma CVD deposited film forming apparatus can be sufficiently solved and the foregoing objects of this invention can be desirably attained.

And what are stated above have been confirmed by the results of the following tests and comparative tests.

Tests

Various modified apparatus of the apparatus illustrated in FIG. 3 which are of 500 mm to 2000 mm in the length L of the surrounding wall (cathode) 1 and of 50 mm to 100 mm in the interval d between the inside face of the surrounding wall (cathode) 1 and the surface of the cylindrical substrate 2' were used. And as the cylindrical substrate 2', an aluminum cylinder of 358 mm in length and 80 mm $\phi$ in outer diameter was used in each case.

In every case, a charge injection inhibition layer, a photoconductive layer and a surface protective layer were successively formed on said aluminum cylinder to obtain a light receiving member under the layer forming conditions shown in Table 1.

TABLE 1

| Conditions | Layer formed | | |
|---|---|---|---|
| | First Layer (Charge injection inhibition layer) | Second Layer (Photoconductive layer) | Third layer (Surface protective layer) |
| Gas used & Flow rate | | | |
| SiH$_4$ gas | 200 SCCM | 200 SCCM | 10 SCCM |
| B$_2$H$_6$ gas | 200 ppm (against SiH$_4$) | — | — |
| CH$_4$ gas | — | — | 200 SCCM |
| Substrate Temperature (°C.) | | 250 ± 5 | |
| Inner Pressure (Torr) | | 0.5 | |
| Discharging Frequency (MHz) | | 13.56 | |
| Discharging Power (W/cm$^2$) | | 0.18 | |
| Gas Flow Speed (m/s) | | 200 | |
| Layer Thickness ($\mu$m) | 2.0 | 20.0 | 0.5 |

For every case, there were evaluated four items; (i) discharging stability upon forming a light receiving layer and with respect to a light receiving member obtained, (ii) homogeneity in layer quality, (iii) charge efficiency and (iv) photosensitivity, respectively in accordance with the below mentioned procedures.

Figure 2:
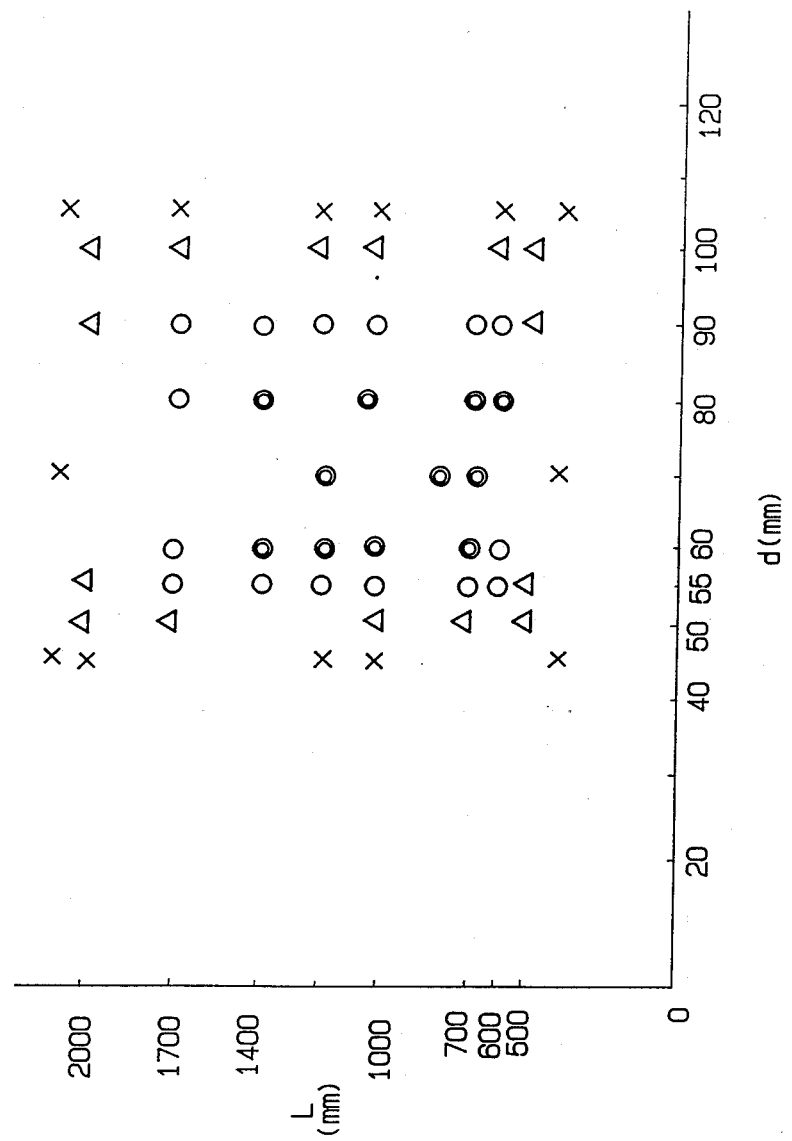
FIG. 2 is a graph illustrating the results of the trials for finding desirable conditions relative to the aforesaid distance d and the aforesaid length L with respect to the plasma CVD deposited film forming apparatus.

And the results obtained were as shown in FIG. 2.

The evaluation was made in view of synthetic judgement including all the evaluation items (i) to (iv) in every case and the evaluation result was expressed by the mark ⊚, ○, Δ or X, in which the mark ⊚ means the case where was excellent in all the four evaluation items;

the mark ○ means the case where was excellent in at least two evaluation items and practically acceptable in the remaining evaluation items;

the mark Δ means the case where was excellent in one evaluation item and practically acceptable in the remaining evaluation items; and the mark X means the case where was not acceptable in at least one evaluation item.

EVALUATION PROCEDURES (i) Discharging stability

A plasma spectrum probe is inserted into an upper position of the film forming space and progressive changes in light emission intensity of SiH* during film forming operation are detected.

And the light emission intensity of said SiH* just after starting the layer forming operation is taken to 100 and the progressive dispersion of the light emission intensity in the film forming space is examined. And the case where the result whose dispersion of the light emission intensity lies in the range of a value ±2 is to be acceptable.

(ii) Homogenity in layer quality

Ten different light receiving members are repeatedly prepared under the same layer forming conditions and the resultant every light receiving member is evaluated with respect to items relative to quality (charge efficiency, photosensitivity and defective image).

The evaluation result is compared to the previously provided standard. And the case where the dispersion of the evaluation result lies in the range of a value ±5 is to be acceptable.

(iii) Charge efficiency

Each of the prepared light receiving members is set to the conventional electrophotographic copying machine and its surface electric potential is measured at three different points; the two points of 30 mm apart from both the ends and the center, under the condition of constant charge while rotating the light receiving member. And the case where the dispersion of the resultant surface electric potential lies in the range of a ±7 V along the longitudinal direction and at the same time, in the range of a ±2 V along the circumferential direction respectively in comparison with the previously provided standard is to be acceptable.

(iv) Photosensitivity

Each of the prepared light receiving members is engaged in charge process in the same way as in the above case (iii) and the surface electric potential is measured under the condition of constant exposure amount. And the case where the dispersion of the resultant surface electric potential lies in the range of a ±5 in comparison with the previously provided standard is to be acceptable.

From the results shown in FIG. 2, it was found that, when the plasma CVD deposited film forming apparatus is so designed that the length L of the surrounding wall (cathode) 1 is to be preferably in the range between 500 and 2000 mm, more preferably between 600 and 1700 mm, and most preferably between 700 and 1400 mm, and the interval d between the inside face of the surrounding wall (cathode) 1 and the surface of the cylindrical substrate 2' is to be preferably between 50 and 100 mm, more preferably between 55 and 90 mm, and most preferably, between 60 and 80 mm, in addition, the ratio of said L to said d, namely a L/d, is to be preferably 5 to 40, more preferably 6.6 to 30, and most preferably, 8.75 to 23.3, a deposited film to be formed in such apparatus will be of excellent homogeneity in the layer quality and also excellent uniformity in the layer thickness.

COMPARATIVE TEST 1

Except using modified apparatuses of the apparatus illustrated in FIG. 3 which are of 250 mm, 1000 mm, 2000 mm and 2250 mm in the length L of the surrounding wall (cathode) 1 and of 40 mm in the interval d between the inside face of the surrounding wall (cathode) 1 and the surface of the cylindrical substrate (anode) 2', the same procedures as in the foregoing Tests were repeated to thereby prepare four different light receiving members. And for each resultant light receiving member, the same evaluations as in the foregoing Tests were conducted.

As a result, it was found that although all the four light receiving members were of dispersions in the range of ±2 for the above evaluation item (i) and were acceptable accordingly, but as for the above evaluation items (ii) to (iv), inferior results were given. In addition, it was also found that every light receiving member received undesirable influences of ion attacks etc. during the film forming operation.

COMPARATIVE TEST 2

Except using modified apparatuses of the apparatus illustrated in FIG. 3 which are of 1000 mm, 1750 mm and 2250 mm in the length L of the surrounding wall (cathode) 1 and of 110 mm in the interval d between the inside face of the surrounding wall (cathode) 1 and the surface of the cylindrical substrate (anode) 2', the same procedures as in the foregoing Tests were repeated to thereby prepare three different light receiving members.

And for each resultant light receiving member, the same evaluations as in the foregoing Tests were conducted.

As a result, it was found that plasma discharge hardly occurred and plasmas generated were unevenly distributed in the film forming space in every case.

And as for every resultant deposited film, it was found that it is acceptable with respect to the above evaluation items (iii) and (iv) but not acceptable with respect to the above evaluation items (i) and (ii).

COMPARATIVE TEST 3

Except using a modified apparatus of the apparatus illustrated in FIG. 3 which is of 2250 mm in the length L of the surrounding wall (cathode) 1 and of 70 mm in the interval between the inside face of the surrounding wall (cathode) 1 and the surface of the cylindrical substrate 2', the same procedures as in the foregoing Tests were repeated to prepare a light receiving member.

And it was evaluated by the same evaluation procedures as in the foregoing Tests.

As a result, it was found that plasmas were unevenly distributed along the longitudinal direction and also along the circumferential direction of the cylindrical substrate 2' and as a result, the resultant light receiving member was inferior in every evaluation item.

COMPARATIVE TEST 4

Except using a modified apparatus of the apparatus illustrated in FIG. 3 which is of 250 mm in the length L of the surrounding wall (cathode) 1 and of 70 mm in the interval d between the inside face of the surrounding wall (cathode) 1 and the surface of the cylindrical substrate 2', the same procedures as in Tests were repeated to prepare a light receiving member.

And it was evaluated by the same evaluation procedures as in the foregoing Tests.

As a result, it was found that raw material gases to generate active species contributing to formation of a deposited film were not sufficiently decomposed in the film forming space, and the resultant light receiving member was inferior in every evaluation item.

COMPARATIVE TEST 5

Except using a modified apparatus of the apparatus illustrated in FIG. 3 which is of 250 mm in the length L of the surrounding wall (cathode) 1 and of 110 mm in the interval between the inside face of the surrounding wall (cathode) 1 and the surface of the cylindrical substrate 2', the same procedures as in the foregoing Tests were repeated to prepare a light receiving member.

And the resultant light receiving member was evaluated by the same evaluation procedures as in the foregoing Tests.

As a result, it was found that discharge hardly occurred and raw material gases were not sufficiently decomposed in the film forming space, and although the resultant light receiving member was acceptable in the foregoing evaluation item (iv), it was inferior in the remaining evaluation items.

Hence, this invention is of the main feature to make improvements in the known plasma CVD deposited film forming apparatus comprising a deposition chamber having a film forming space which is sealed and formed by a surrounding wall functioning as a cathode, an upper wall and a bottom wall, which contains a means for holding a cylindrical substrate functioning as an anode in the film forming space and which is provided with a film forming raw material gas supplying means, a means for impressing a discharging power between said cathode and said anode and a vacuuming means, and it is characterized in that the length L of said cathode and the interval d between the inside face of said cathode and the surface of said anode is so designed as to satisfy the equation: $5 \leq L/d \leq 40$.

According to the improved apparatus of this invention, a desired light receiving member, even if it is of a large square, can be easily and effectively prepared.

And any known film forming raw materials can be used as long as they are gaseous or gasifiable materials and capable of contributing to formation of a deposited film for preparing such light receiving member by using the improved plasma CVD deposited film forming apparatus of this invention.

According to the improved apparatus of this invention, it is possible to firstly excite a film forming raw material gas to be active species with an appropriate excitation energy in a activation chamber situated apart from the deposition chamber and to then introduce such active species introduce into the reaction chamber.

Further, the improved apparatus of this invention makes it possible to stably and effectively form a doped deposited film of either p-type or n-type using a raw material gas imparting a p-type or n-type dopant.

There is not any particular limitation for the cylindrical substrate 2') to be used, and there can be used any known cylinders which can be used as the substrate to prepare a light receiving member and which can function as the anode in the deposition chamber.

For the formation of a desired constituent layer for a light receiving member using the improved apparatus of this invention, the conditions for forming such layer can be properly determined depending upon the kind of a layer to be formed and other related factors including the kind of substrate, the kind of a raw material gas, etc.

What is claimed is:

1. In a capacitive-coupled type plasma chemical vapor deposition apparatus for forming a light receiving layer on a cylindrical substrate so as to produce a photosensitive member for use in electrophotography, which includes a substantially enclosed deposition chamber having a film forming space surrounded by a circumferential wall functioning as a cathode, means for receiving a cylindrical substrate which functions as an anode in the film forming space disposed on at least one of an upper wall and a bottom wall, a gas supplying means for introducing film forming raw material into said film forming space, a power source electrically connected to said cathode and said anode capable of creating discharge in said film forming space, and an exhausting means for removing gases from said film forming space, wherein the improvement comprises the length L of said cathode to be in the range of from 700 to 1400 mm and said means for receiving said cylindrical substrate provides that the interval d between the inside face of said cathode and the surface of said anode is to be in the range of from 60 to 80 mm.

* * * * *

UNITED STATES PATENT AND TRADEMARK OFFICE
CERTIFICATE OF CORRECTION

PATENT NO. : 4,958,591

DATED : September 25, 1990

INVENTOR(S) : ITARU YAMAZAKI

Page 1 of 3

It is certified that error appears in the above-identified patent and that said Letters Patent is hereby corrected as shown below:

Title Page:

IN [56] REFERENCES CITED

Attorney, Agent, or Firm, "Fitzpatrick, Cella Harper & Scinto" should read --Fitzpatrick, Cella, Harper & Scinto--.

IN [57] ABSTRACT

Line 11, "vacumming" should read --vacuuming--.
Line 16, "memer," should read --member,--.

COLUMN 1

Line 49, "react" should read --react with--.

COLUMN 2

Line 7, "liberation holes 10, 10, —to" should read --liberation holes 10, 10, --- to--.
Line 22, "gas liberation holes 10, 10, —of" should read --gas liberation holes 10, 10, --- of--.
Line 40, "holes 10, 10, —either" should read --holes 10, 10, --- either--.
Line 60, "to a" should read --to form a--.
Line 61, "an" should read --a--.

COLUMN 3

Line 4, "becomes" should read --become--.
Line 10, "an" should read --a--.
Line 24, "that" should read --those--.

UNITED STATES PATENT AND TRADEMARK OFFICE
CERTIFICATE OF CORRECTION

PATENT NO. : 4,958,591

DATED : September 25, 1990

INVENTOR(S) : ITARU YAMAZAKI

It is certified that error appears in the above-identified patent and that said Letters Patent is hereby corrected as shown below:

COLUMN 3

Line 31, "enable" should read --enables--.
    Line 33, "an" should read --a--.
    Line 63, "EXAMPLARY" should read --EXEMPLARY--.

COLUMN 4

Line 12, "on" should be deleted.
    Line 33, "becomes" should read --become--.

COLUMN 5

Line 47, "items; (i)" should read --items: (i)--.

COLUMN 6

Line 16, "Homogenity" should read --Homogeneity--.

COLUMN 7

Line 49, "interval" should read --interval d--.

COLUMN 8

Line 13, "interval" should read --interval d--.
    Line 53, "a" should read --an--.
    Line 55, "introduce" should be deleted.
    Line 61, "substrate 2')" should read --substrate 2'--.

UNITED STATES PATENT AND TRADEMARK OFFICE
CERTIFICATE OF CORRECTION

PATENT NO. : 4,958,591

DATED : September 25, 1990

INVENTOR(S) : ITARU YAMAZAKI

It is certified that error appears in the above-identified patent and that said Letters Patent is hereby corrected as shown below:

COLUMN 10

Line 1, "film," should read --film--.

Signed and Sealed this

Twentieth Day of October, 1992

Attest:

DOUGLAS B. COMER

Attesting Officer    Acting Commissioner of Patents and Trademarks